US011631602B2

(12) United States Patent
Pathangi (10) Patent No.: US 11,631,602 B2
(45) Date of Patent: Apr. 18, 2023

(54) ENABLING SCANNING ELECTRON MICROSCOPE IMAGING WHILE PREVENTING SAMPLE DAMAGE ON SENSITIVE LAYERS USED IN SEMICONDUCTOR MANUFACTURING PROCESSES

(71) Applicant: KLA CORPORATION, Milpitas, CA (US)

(72) Inventor: Hari Sriraman Pathangi, Chennai (IN)

(73) Assignee: KLA CORPORATION, Milpitas, CA (US)

( * ) Notice: Subject to any disclaimer, the term of this patent is extended or adjusted under 35 U.S.C. 154(b) by 6 days.

(21) Appl. No.: 17/182,925

(22) Filed: Feb. 23, 2021

(65) Prior Publication Data
US 2021/0407834 A1 Dec. 30, 2021

Related U.S. Application Data (60) Provisional application No. 63/063,975, filed on Aug. 11, 2020.

(30) Foreign Application Priority Data

Jun. 26, 2020 (IN) .............................. 202041027103

(51) Int. Cl.
*H01L 21/67* (2006.01)
*H01J 37/22* (2006.01)
(Continued)

(52) U.S. Cl.
CPC ........ *H01L 21/67288* (2013.01); *H01J 37/20* (2013.01); *H01J 37/222* (2013.01);
(Continued)

(58) Field of Classification Search
CPC ... H01L 21/67288; H01J 37/20; H01J 37/222; H01J 37/28; H01J 2237/2007;
(Continued)

(56) References Cited

U.S. PATENT DOCUMENTS 6,768,324 B1 * 7/2004 Yamada ................ H01J 37/256
324/754.22
6,803,572 B2 10/2004 Veneklasen et al.
(Continued)

FOREIGN PATENT DOCUMENTS

CN 108107066 A 6/2018
CN 111201585 A 5/2020
(Continued)

OTHER PUBLICATIONS

WIPO, ISR for International Application No. PCT/US2021/038788, dated Sep. 29, 2021.
(Continued)

*Primary Examiner* — David A Vanore
(74) *Attorney, Agent, or Firm* — Hodgson Russ LLP (57) ABSTRACT

During electron beam imaging of a semiconductor wafer, the electron beam is adjusted to a first electron dose/nm²/time value below a damage threshold for an image frame grab of a site on the semiconductor wafer. Then the electron beam is adjusted to a second electron dose/nm²/time value different from the first electron dose/nm²/time value for a second image frame grab of the site. The second electron dose/nm²/time value can be above the damage threshold.

13 Claims, 5 Drawing Sheets

(51) Int. Cl.
*H01J 37/28* (2006.01)
*H01J 37/20* (2006.01)

(52) U.S. Cl.
CPC ....... *H01J 37/28* (2013.01); *H01J 2237/2007* (2013.01); *H01J 2237/2814* (2013.01)

(58) Field of Classification Search
CPC ....... H01J 2237/2814; H01J 2237/2809; H01J 2237/2813; G03F 7/70616
See application file for complete search history.

(56) References Cited

U.S. PATENT DOCUMENTS

| | | | |
|---|---|---|---|
| 7,218,126 B2 * | 5/2007 | Cheng | H01J 37/28 324/754.22 |
| 7,923,700 B2 | 4/2011 | Nishiyama | |
| 10,161,890 B2 | 12/2018 | Ginsberg et al. | |
| 10,465,293 B2 * | 11/2019 | Miller | G01N 1/32 |
| 10,651,009 B2 * | 5/2020 | Hoogenboom | H01J 37/21 |
| 2010/0178619 A1 * | 7/2010 | Huang | G03F 7/095 430/325 |
| 2014/0061032 A1 * | 3/2014 | Miller | C23F 1/04 204/298.36 |

FOREIGN PATENT DOCUMENTS

| | | |
|---|---|---|
| EP | 0653774 B1 | 7/2002 |
| JP | 2002056793 A | 2/2002 |
| JP | 2011196731 A | 10/2011 |
| JP | 2013134952 A | 7/2013 |
| JP | 5712073 B2 | 5/2015 |
| KR | 20080090118 A | 10/2008 |
| KR | 20170066846 A | 6/2017 |

OTHER PUBLICATIONS

Reichelt, "Scanning Electron Microscopy," Science of Microscopy, 2008, Chapter 3, pp. 133-272.

* cited by examiner

| SR --> | Slow | | | | Fast |
|---|---|---|---|---|---|
| | e/nm2/t | | | | |
| FoV (um) | | | | | |
| 1 | 73728 | 18432 | 4608 | 1843 | 461 |
| 2 | 18432 | 4608 | 1152 | 461 | 115 |
| 3 | 8192 | 2048 | 512 | 205 | 51 |
| 4 | 4608 | 1152 | 288 | 115 | 29 |
| 5 | 2949 | 737 | 184 | 74 | 18 |
| 6 | 2048 | 512 | 128 | 51 | 13 |
| 7 | 1505 | 376 | 94 | 38 | 9 |
| 8 | 1152 | 288 | 72 | 29 | 7 |
| 9 | 910 | 228 | 57 | 23 | 6 |
| 10 | 737 | 184 | 46 | 18 | 5 |
| 11 | 609 | 152 | 38 | 15 | 4 |
| 12 | 512 | 128 | 32 | 13 | 3 |
| 13 | 436 | 109 | 27 | 11 | 3 |
| 14 | 376 | 94 | 24 | 9 | 2 |
| 15 | 328 | 82 | 20 | 8 | 2 |
| 16 | 288 | 72 | 18 | 7 | 2 |
| 17 | 255 | 64 | 16 | 6 | 2 |
| 18 | 228 | 57 | 14 | 6 | 1 |
| 19 | 204 | 51 | 13 | 5 | 1 |
| 20 | 184 | 46 | 12 | 5 | 1 |
| 21 | 167 | 42 | 10 | 4 | 1 |
| 22 | 152 | 38 | 10 | 4 | 1 |
| 23 | 139 | 35 | 9 | 3 | 1 |
| 24 | 128 | 32 | 8 | 3 | 1 |
| 25 | 118 | 29 | 7 | 3 | 1 |
| 26 | 109 | 27 | 7 | 3 | 1 |
| 27 | 101 | 25 | 6 | 3 | 1 |
| 28 | 94 | 24 | 6 | 2 | 1 |
| 29 | 88 | 22 | 5 | 2 | 1 |
| 30 | 82 | 20 | 5 | 2 | 1 |
| 31 | 77 | 19 | 5 | 2 | 0 |
| 32 | 72 | 18 | 5 | 2 | 0 |

ENABLING SCANNING ELECTRON MICROSCOPE IMAGING WHILE PREVENTING SAMPLE DAMAGE ON SENSITIVE LAYERS USED IN SEMICONDUCTOR MANUFACTURING PROCESSES

CROSS-REFERENCE TO RELATED APPLICATIONS

This application claims priority to Indian Patent Application No. 202041027103 filed Jun. 26, 2020 and U.S. Patent Application No. 63/063,975 filed Aug. 11, 2020, the disclosures of which are hereby incorporated by reference.

FIELD OF THE DISCLOSURE

This disclosure relates to semiconductor imaging.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

Scanning electron microscope (SEM) imaging of wafers used in semiconductor manufacturing is commonly used for metrology, failure analysis, defect inspection, and defect review. SEM tools typically operate at the highest possible throughput to keep the cost of ownership low while provided feedback to the manufacturing line at regular intervals. The throughput can be lowered by reducing the beam current. Beam current controls the total number of electrons hitting a sample per instance of time. A higher beam current can enable the SEM tool to grab high quality images of the sample using fewer frames and/or a faster scan rate, which increases throughput of the SEM tool. However, higher beam current can damage organic layers on the wafer. These organic layers can include photoresists, antireflective coatings, or spin-on layers for lithography reflectivity control. Other inorganic layers sensitive to electron beam exposure present on the wafer also can be damaged at higher beam currents.

A maximum beam current can be implemented during manufacturing to avoid this damage. This can be applied to after develop inspection (ADI) wafers after lithographic processes and other sensitive layers. For example, a maximum beam current can be implemented for overlay and critical dimension uniformity measurement use-cases, which are usually done at an ADI step to be able to rework wafers that are out of specification. However, a maximum beam current can restrict the throughput on an SEM tool. A maximum beam current may still lead to damage if the layer materials or applications change.

Therefore, improved methods and systems are needed.

BRIEF SUMMARY OF THE DISCLOSURE

A method is provided in a first embodiment. In the method, an electron beam for an image frame grab of a site on a semiconductor wafer is directed at a first electron dose/nm$^2$/time value below a damage threshold. The semiconductor wafer includes a layer of an organic material. The electron beam is subsequently directed for a second image frame grab of the site at a second electron dose/nm$^2$/time value greater than the first electron dose/nm$^2$/time value.

The damage threshold can depend on beam current.

The second electron dose/nm$^2$/time value can be above the damage threshold.

The method can further include imaging the site using the electron beam with the second electron dose/nm$^2$/time value.

The layer may be a photoresist layer or an antireflective coating.

The method can further include determining, using the processor, the damage threshold using data for the organic material.

A system is provided in a second embodiment. The system includes an electron beam source that generates an electron beam, a chuck configured to hold a semiconductor wafer in a path of the electron beam, a detector that receives the electron beam from the semiconductor wafer, and a processor in electronic communication with the electron beam source and the detector. The semiconductor wafer includes a layer of an organic material. The processor is configured to adjust the electron beam to a first electron dose/nm$^2$/time value below a damage threshold for an image frame grab of a site on the semiconductor wafer and adjust the electron beam to a second electron dose/nm$^2$/time value greater than the first electron dose/nm$^2$/time value for a second image frame grab of the site subsequent to the first image frame grab of the site.

The damage threshold can depend on beam current.

The second electron dose/nm$^2$/time value can be above the damage threshold.

The site can be imaged using the electron beam with the second electron dose/nm$^2$/time value.

The layer may be a photoresist layer or an antireflective coating.

The processor can be further configured to determine the damage threshold using data for the organic material. The processor can retrieve the data for the organic material from an electronic data storage unit. The data includes results for the organic material based on a scan rate and a field of view.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein can prevent sample damage when using an SEM tool. High quality and high throughput electron beam usage can be provided for wafer inspection, wafer review, or wafer metrology.

Figure 1:
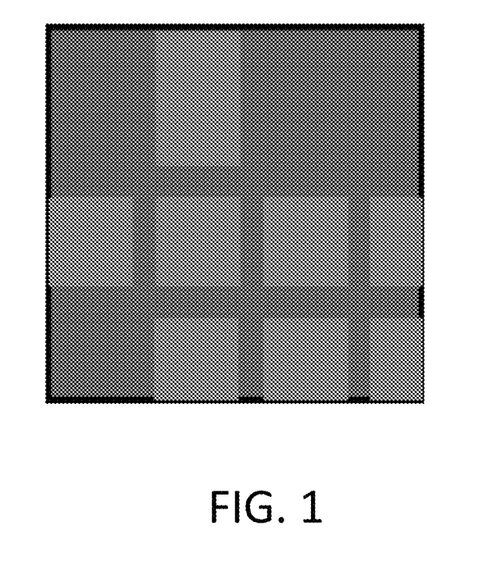
FIG. 1 is an exemplary SEM image showing no damage.
Figure 2:
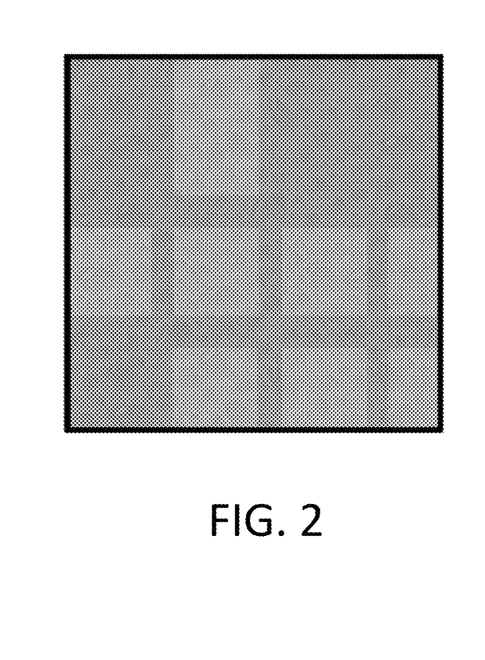
FIG. 2 is an exemplary SEM image showing bubble-like damage due to high electron dose.
Figure 3:
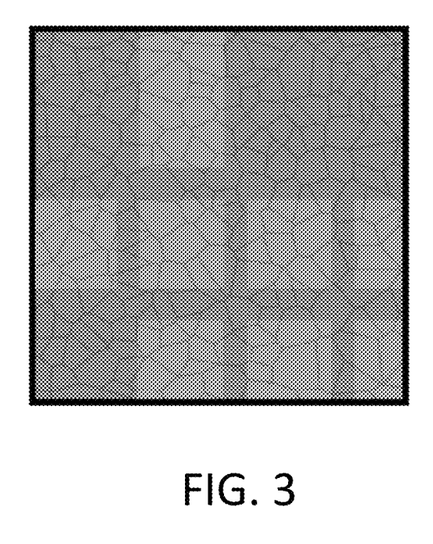
FIG. 3 is an exemplary SEM image showing honeycomb or Voronoi-like pattern damage due to high electron dose.

Typically, beam currents (BC) greater than 5 nA can damage an organic layer or a material used in semiconductor processing that are sensitive to electron beams. This damage is shown in FIGS. 1-4. FIG. 1 shows a SEM image with no damage. FIGS. 2-3 show various types of damage caused by the electron beam. Edge roughness of the patterns also can be affected due to this damage, such as that in FIG. 2.

The electron dose (e) affects damage of these materials by the electron beam. This can be measured as $e/nm^2/time$, where time (t) is the amount of time required to grab a frame at particular imaging conditions. While $nm^2$ is specifically listed as an area measurement, other area measurements can be used. Damage probability can be affected by changing the imaging conditions of the first image frame used at a particular site on the semiconductor wafer. In an example, damage was observed for beam currents greater than 20 nA, even when using same $e/nm^2/time$ value for different beam currents. The threshold dose for damage changes with beam current. For lower beam current, the threshold dose is proportionally lower.

The damage is not only caused by electron dose. Thus, changing the dwell time may not always eliminate or reduce damage. A certain minimum dwell time is typically needed for tool performance. Lowering the dwell time to prevent damage will result in lower performance of the tool, which usually is not acceptable to semiconductor manufacturers.

Figure 6A:
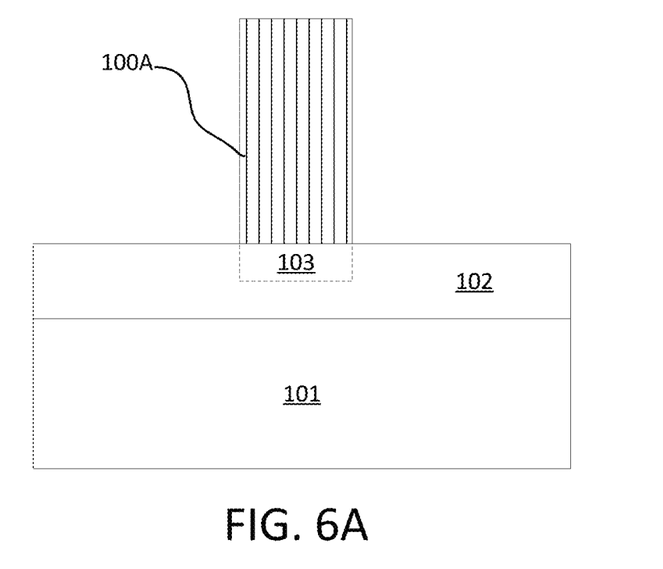
FIGS. 6A-6B illustrate a method in accordance with the present disclosure.
Figure 6B:
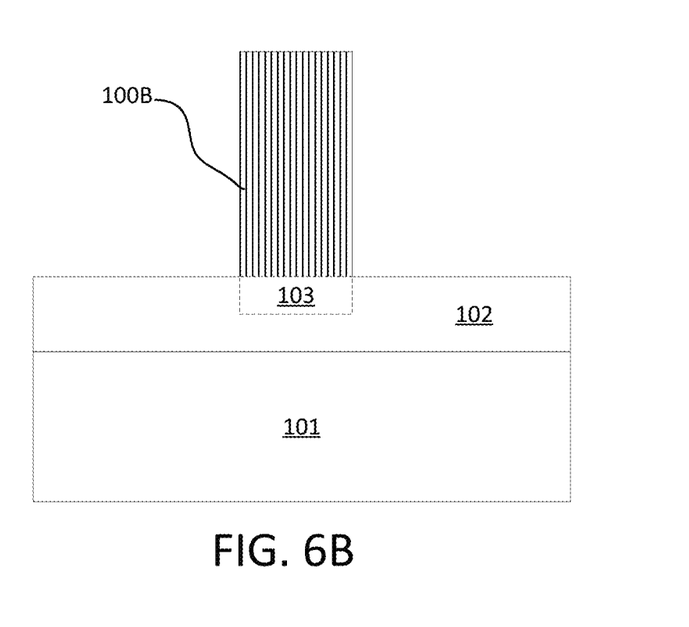

While high beam currents are a potential cause of damage, high beam currents can be used without damaging the materials on the wafer using the embodiments disclosed herein. The embodiments disclosed herein demonstrate a solution to successfully use high beam currents without damage. As disclosed herein, $e/nm^2/time$ determines ADI damage. FIGS. 6A-6B illustrate a method 100 which can reduce or eliminate ADI or other damage.

In FIG. 6A, a semiconductor wafer 101 includes a layer of organic material 102. The layer of organic material 102 can be, for example, a photoresist or an antireflective coating. The photoresist may be a 193$i$ photoresist or other photoresists used in semiconductor manufacturing. The electron beam 100A is directed to a site 103 on the semiconductor wafer 101 for an image frame grab. The electron beam 100A has a first electron dose/$nm^2$/time value below a damage threshold. The first electron dose/$nm^2$/time value may be at a particular beam current. The electron beam 100A can be part of a pre-dosing step prior to an actual image grab sequence. This pre-dosing step may occur at a single frame. The pre-dosing step can harden the layer of organic material 102. The photoresist chemistry or other material properties of the layer of organic material 102 can change with the pre-dosing step. For example, the photoresist chains can be cross-linked in an electron beam exposure or other mechanisms can occur. The exact mechanism can depend on the photoresist chemistry or the functional groups in the photoresist.

The damage threshold for a particular layer or material can be determined by adjusting a dose skew on the wafer to determine which minimum dose gives damage. Thus, experimental results of various electron beam properties for a layer or material can be stored and accessed to determine the damage threshold.

Then in FIG. 6B, the electron beam 100B is subsequently directed for a second image frame grab at the site 103. The electron beam 100B has a second electron dose/$nm^2$/time value different from the first electron dose/$nm^2$/time value. The electron beam 100B has a second electron dose/$nm^2$/time value greater than the first electron dose/$nm^2$/time value in an instance. However, the second electron dose/$nm^2$/time value can be above, below, or equal to the damage threshold. In an instance, the second electron dose/$nm^2$/time value is greater than the damage threshold, which can increase throughput without damaging the wafer. The site 103 can be imaged using the electron beam 100B with the second electron dose/$nm^2$/time value.

The formula to determine the first electron dose is $$(e/nm^2/frame) = \frac{((625 * BC)/SR)}{((FoV * 1000)/PD)^2}.$$

In this formula, e is dose, BC is beam current, SR is scan rate (i.e., dwell time), PD is pixel density (i.e., image size), and FoV is field of view in microns. The value should be lower than the damage threshold. The same formula can be used to determine the second electron dose, but the value is not necessarily lower than the damage threshold. In an example, the first electron dose is approximately 30 and the second electron dose is approximately 600.

While the formula is disclosed using $e/nm^2/frame$, the same can be applied to $e/nm^2/time$. There may not be enough signal in one frame for an image using $e/nm^2/time$. Thus, an average of multiple frames may be used for an image. An $e/nm^2/frame$ value can be used instead.

Figure 5:
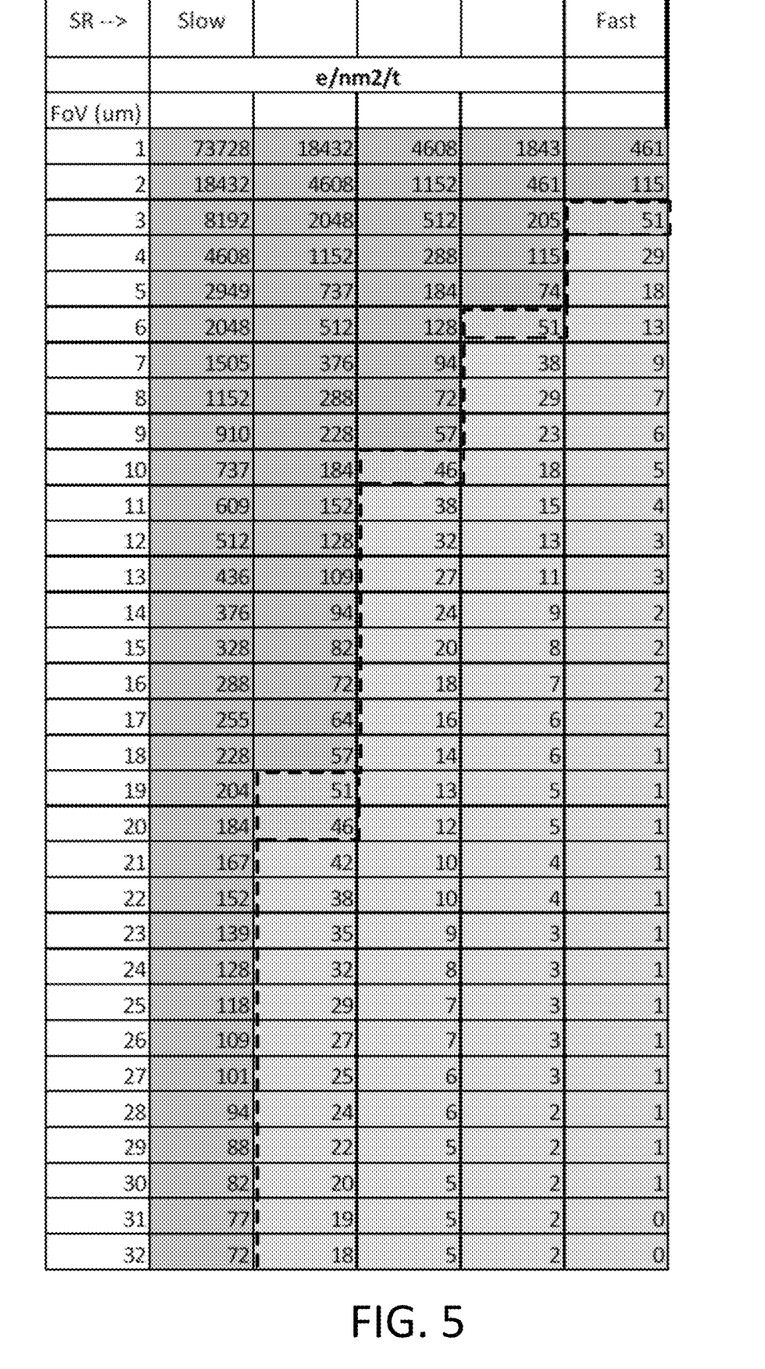
FIG. 5 is a table of results showing modulation behavior at different electron dose regimes.

The electron dose $e/nm^2/t$ used during the image frame grab determines damage to the site 103 or the layer of organic material 102. The field of view can be set by a user, which can affect the size of the image frame grab. However, damage can occur irrespective of the field of view as soon as the damage threshold is exceeded. For example, FIG. 5 shows a table of results showing modulation behavior at different electron dose regimes based on experimental data at high beam currents. In the experiment with results in FIG. 5, scan rate (SR) and field of view (FoV) were changed to modulate the $e/nm^2/time$ value. There is a damage threshold $e/nm^2/time$ above which damage occurs.

The beam current, scan rate, pixel density, and field of view all can affect the beam conditions. Thus, changing any of these values can affect whether the first electron dose or second electron dose exceeds a damage threshold. For example, the damage threshold can depend on the beam current of the electron beam 100A or 100B because this affects the amount of electrons directed at the wafer at a given time.

In FIG. 5, $e/nm^2/time<40$ did not result in damage to the site. The material behavior of the photoresist did not result in damage. For example, the functional groups may have been strong enough to avoid damage. $e/nm^2/time>51$ did result in damage to the site, which can result in a 100% damage probability to the wafer. $e/nm^2/time$ from approximately 40-51 resulted in intermittent damage from multiple sites, which can result in approximately 60% to 70% damage probability to the wafer. The values with damage, intermittent damage, and no damage are outlined with dashed lines and shaded. These results are specific to a particular material or film. Different materials or film properties may need to be experimentally evaluated to provide a similar table of data.

The probability of inducing damage at a particular site also can depends on the imaging history of the site. If the first SEM frame at a particular site (e.g., site 103) is exposed with $e/nm^2/time$ less than a damage threshold, then subsequent frames can likely be grabbed at any $e/nm^2/time$ value without causing damage. If the first SEM frame is exposed with $e/nm^2/time$ greater than a damage threshold, then the site can be damaged. This damage may be like that in FIG. 2 or FIG. 3. The damage may be permanent. After a site is damaged, reversal of the damage may be impossible.

There may be an upper threshold for the subsequent frames. Even if the first SEM frame at a particular site (e.g., site 103) is exposed with $e/nm^2/time$ less than a damage threshold, there may be $e/nm^2/t$ values for the second SEM frame that still result in damage. This may be dependent on material or film properties.

Figure 4:
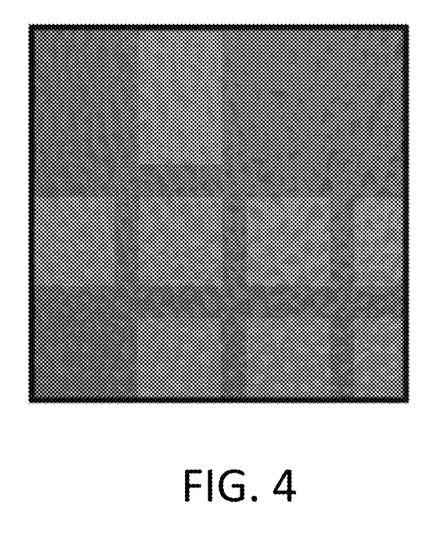
FIG. 4 is an exemplary SEM image showing pit-like damage due to high electron dose.

Even after a particular site is damaged, it is possible to zoom out and grab images without damage around the damaged area, which is illustrated in FIG. 4.

An electron beam is disclosed as a way to perform the imaging. Light and/or heat can be used with or without the electron beam to perform the pre-dosing step. In an instance, a light and/or heat step is performed prior to the electron beam pre-dosing step. Light and/or heat can stabilize the photoresist and affect its chemistry. Lamps and/or heaters may be used to affect the photoresist. Light and/or heat may be applied with the electron beam in another instance.

Figure 7:
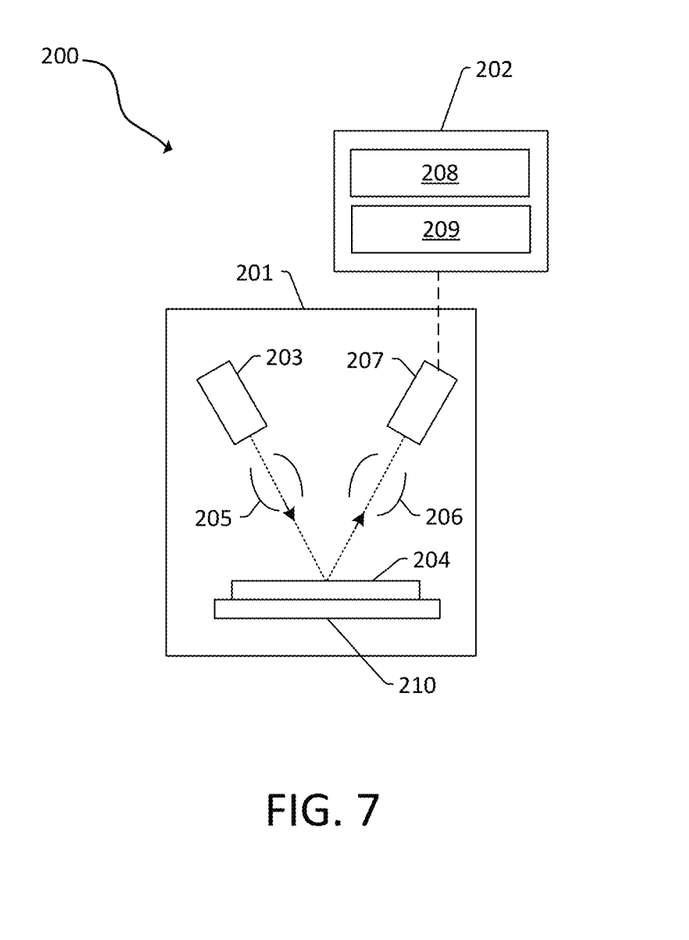
FIG. 7 is an embodiment of a system in accordance with the present disclosure.

FIG. 7 is a block diagram of an embodiment of a system 200. The system 200 includes a wafer inspection tool (which includes the electron column 201) configured to generate images of a wafer 204.

The wafer inspection tool includes an output acquisition subsystem that includes at least an energy source and a detector. The output acquisition subsystem may be an electron beam-based output acquisition subsystem. For example, in one embodiment, the energy directed to the wafer 204 includes electrons, and the energy detected from the wafer 204 includes electrons. In this manner, the energy source may be an electron beam source. In one such embodiment shown in FIG. 7, the output acquisition subsystem includes electron column 201, which is coupled to computer subsystem 202. A stage 210 may hold the wafer 204.

As also shown in FIG. 7, the electron column 201 includes an electron beam source 203 configured to generate electrons that are focused to wafer 204 by one or more elements 205. The electron beam source 203 may include, for example, a cathode source or emitter tip. The one or more elements 205 may include, for example, a gun lens, an anode, a beam limiting aperture, a gate valve, a beam current selection aperture, an objective lens, and a scanning subsystem, all of which may include any such suitable elements known in the art.

Electrons returned from the wafer 204 (e.g., secondary electrons) may be focused by one or more elements 206 to detector 207. One or more elements 206 may include, for example, a scanning subsystem, which may be the same scanning subsystem included in element(s) 205.

The electron column 201 also may include any other suitable elements known in the art.

Although the electron column 201 is shown in FIG. 7 as being configured such that the electrons are directed to the wafer 204 at an oblique angle of incidence and are scattered from the wafer 204 at another oblique angle, the electron beam may be directed to and scattered from the wafer 204 at any suitable angles. In addition, the electron beam-based output acquisition subsystem may be configured to use multiple modes to generate images of the wafer 204 (e.g., with different illumination angles, collection angles, etc.). The multiple modes of the electron beam-based output acquisition subsystem may be different in any image generation parameters of the output acquisition subsystem.

Computer subsystem 202 may be coupled to detector 207 as described above. The detector 207 may detect electrons returned from the surface of the wafer 204 thereby forming electron beam images of the wafer 204. The electron beam images may include any suitable electron beam images. Computer subsystem 202 may be configured to perform any of the functions described herein using the output of the detector 207 and/or the electron beam images. Computer subsystem 202 may be configured to perform any additional step(s) described herein. A system 200 that includes the output acquisition subsystem shown in FIG. 7 may be further configured as described herein.

It is noted that FIG. 7 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system. In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 7 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 202 includes a processor 208 and an electronic data storage unit 209. The processor 208 may include a microprocessor, a microcontroller, or other devices.

The computer subsystem 202 may be coupled to the components of the system 200 in any suitable manner (e.g., via one or more transmission media, which may include wired and/or wireless transmission media) such that the processor 208 can receive output. The processor 208 may be configured to perform a number of functions using the output. The wafer inspection tool can receive instructions or other information from the processor 208. The processor 208 and/or the electronic data storage unit 209 optionally may be in electronic communication with another wafer inspection tool, a wafer metrology tool, or a wafer review tool (not illustrated) to receive additional information or send instructions.

The processor 208 is in electronic communication with the wafer inspection tool, such as the detector 207. The processor 208 may be configured to process images generated using measurements from the detector 207. The processor 208 also may send instructions to perform embodiments of the method in FIGS. 6A-6B.

The computer subsystem 202, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 208 and electronic data storage unit 209 may be disposed in or otherwise part of the system 200 or another device. In an example, the processor 208 and electronic data storage unit 209 may be part of a standalone control unit or in a centralized quality control unit. Multiple processors 208 or electronic data storage units 209 may be used. The electronic data storage unit 209 may contain or otherwise store data for organic materials. This data can include information used to determine a damage threshold.

The processor 208 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 208 to implement various methods and functions may be stored in readable storage media, such as a memory in the electronic data storage unit 209 or other memory.

If the system 200 includes more than one computer subsystem 202, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 208 may be configured to perform a number of functions using the output of the system 200 or other output. For instance, the processor 208 may be configured to send the output to an electronic data storage unit 209 or another storage medium. The processor 208 may be configured according to any of the embodiments described herein. The processor 208 also may be configured to perform other functions or additional steps using the output of the system 200 or using images or data from other sources.

In an instance, the processor 208 is configured to adjust the electron beam to a first electron dose/$nm^2$/time value below a damage threshold for an image frame grab of a site on the semiconductor wafer 204. The processor 208 is also configured to adjust the electron beam to a second electron dose/$nm^2$/time value different from the first electron dose/$nm^2$/time value for a second image frame grab of the site subsequent to the first image frame grab of the site. The second electron dose/$nm^2$/time value can be above, below, or equal to the damage threshold. The second electron dose/$nm^2$/time value is above the damage threshold in an example. The system 200 can image the site using the electron beam with the second electron dose/$nm^2$/time value.

The processor 208 can further be configured to determine the damage threshold using data for the organic material. The processor 208 can retrieve the data for the organic material from an electronic data storage unit, such as the electronic data storage unit 209. The data includes results for the organic material based on scan rate and field of view. The data also can include results based on beam current or pixel density. The processor 208 can determine a value of e/$nm^2$/time that is below the damage threshold based on the results for the particular organic material and any variables that are already set. For example, if the field of view is 25 µm for a particular organic material, the processor 208 can determine a damage threshold, a scan rate that provides an e/$nm^2$/time that is below the damage threshold, and/or other variables that provide an e/$nm^2$/time that is below the damage threshold. The processor 208 also can determine e/$nm^2$/time values for subsequent image frame grabs.

The processor 208 or computer subsystem 202 may be part of a defect review system, an inspection system, a metrology system, or some other type of system. Thus, the embodiments disclosed herein describe some configurations that can be tailored in a number of manners for systems having different capabilities that are more or less suitable for different applications.

The processor 208 may be communicatively coupled to any of the various components or sub-systems of system 200 in any manner known in the art. Moreover, the processor 208 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 208 and other subsystems of the system 200 or systems external to system 200.

Various steps, functions, and/or operations of system 200 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 208 (or computer subsystem 202) or, alternatively, multiple processors 208 (or multiple computer subsystems 202). Moreover, different sub-systems of the system 200 may include one or more computing or logic systems. Therefore, the above description should not be interpreted as a limitation on the present disclosure but merely an illustration.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   directing an electron beam for an image frame grab of a site on a semiconductor wafer at a first electron dose value below a damage threshold, wherein the semiconductor wafer includes a layer of an organic material; and
   subsequently directing the electron beam for a second image frame grab of the site at a second electron dose value greater than the first electron dose value, wherein the first electron dose value and the second electron dose value are each determined using a dose, an area receiving the electron dose, and a duration to grab the image frame grab.

2. The method of claim 1, wherein the second electron dose value is above the damage threshold.

3. The method of claim 1, further comprising imaging the site using the electron beam with the second electron dose value.

4. The method of claim 1, wherein the layer is a photoresist layer.

5. The method of claim 1, wherein the layer is an antireflective coating.

6. The method of claim 1, wherein the first electron dose value and the second electron dose value are measured in electron dose/nm$^2$/time.

7. A system comprising:
   an electron beam source that generates an electron beam;
   a chuck configured to hold a semiconductor wafer in a path of the electron beam, wherein the semiconductor wafer includes a layer of an organic material;
   a detector that receives the electron beam from the semiconductor wafer; and
   a processor in electronic communication with the electron beam source and the detector, wherein the processor is configured to:
      adjust the electron beam to a first electron dose value below a damage threshold for an image frame grab of a site on the semiconductor wafer; and
      adjust the electron beam to a second electron dose value greater than the first electron dose value for a second image frame grab of the site subsequent to the first image frame grab of the site, wherein the first electron dose value and the second electron dose value are each determined using a dose, an area receiving the electron dose, and a duration to grab the image frame grab.

8. The system of claim 7, wherein the second electron dose value is above the damage threshold.

9. The system of claim 7, further comprising imaging the site using the electron beam with the second electron dose value.

10. The system of claim 7, wherein the layer is a photoresist layer.

11. The system of claim 7, wherein the layer is an antireflective coating.

12. The system of claim 7, wherein the processor is further configured to determine the damage threshold using data for the organic material, wherein the processor retrieves the data for the organic material from an electronic data storage unit, and wherein the data includes results for the organic material based on a scan rate and a field of view.

13. The system of claim 7, wherein the first electron dose value and the second electron dose value are measured in electron dose/nm$^2$/time.

* * * * *